(12) United States Patent
Basu et al.

(10) Patent No.: US 9,343,569 B2
(45) Date of Patent: May 17, 2016

(54) VERTICAL COMPOUND SEMICONDUCTOR FIELD EFFECT TRANSISTOR ON A GROUP IV SEMICONDUCTOR SUBSTRATE

(71) Applicant: International Business Machines Corporation, Armonk, NY (US)

(72) Inventors: Anirban Basu, Elmsford, NY (US); Bahman Hekmatshoartabari, White Plains, NY (US); Davood Shahrjerdi, White Plains, NY (US)

(73) Assignee: INTERNATIONAL BUSINESS MACHINES CORPORATION, Armonk, NY (US)

(*) Notice: Subject to any disclaimer, the term of this patent is extended or adjusted under 35 U.S.C. 154(b) by 10 days.

(21) Appl. No.: 14/283,450

(22) Filed: May 21, 2014

(65) Prior Publication Data

US 2015/0340495 A1    Nov. 26, 2015

(51) Int. Cl.
*H01L 29/66* (2006.01)
*H01L 21/00* (2006.01)
*H01L 21/84* (2006.01)
*H01L 29/78* (2006.01)

(52) U.S. Cl.
CPC ............ *H01L 29/7827* (2013.01); *H01L 29/66* (2013.01); *H01L 29/66666* (2013.01); *H01L 29/78* (2013.01)

(58) Field of Classification Search
CPC . H01L 27/1203; H01L 21/84; H01L 29/7827; H01L 29/66666; H01L 29/78; H01L 29/66
USPC ............................ 257/347, 263; 438/269, 156
See application file for complete search history.

(56) References Cited

U.S. PATENT DOCUMENTS

| 4,951,102 | A | * | 8/1990 | Beitman | H01L 27/0922 257/329 |
| 5,208,172 | A | * | 5/1993 | Fitch | H01L 21/823487 257/E21.41 |
| 5,285,093 | A | * | 2/1994 | Lage | H01L 27/1108 257/329 |
| 5,324,673 | A | * | 6/1994 | Fitch | H01L 21/28525 257/329 |
| 5,554,870 | A | * | 9/1996 | Fitch | H01L 27/1104 257/329 |

(Continued)

OTHER PUBLICATIONS

Otake, H. et al., "Vertical GaN-Based Trench Gate Metal Oxide Semiconductor Field-Effect Transistors on GaN Bulk Substrates" Appl. Phys. Express (Jan. 2008) pp. 011105-1-011105-3, vol. 1.

*Primary Examiner* — Lex Malsawma
*Assistant Examiner* — Eric Jones
(74) *Attorney, Agent, or Firm* — Scully, Scott, Murphy & Presser, P.C.; Louis J. Percello, Esq.

(57) ABSTRACT

Group IV semiconductor devices can be formed on a semiconductor-on-insulator substrate including a handle substrate containing a group IV semiconductor material. A cavity is formed to physically expose a top surface of the handle substrate through a stack, from bottom to top, of a buried insulator layer, a doped semiconductor material portion in a top semiconductor layer, and a dielectric material layer. A gate dielectric is formed around the cavity by a conformal deposition of a dielectric material layer and an anisotropic etch. A lower active region, a channel region, and an upper active region are formed by selective epitaxy processes in, and/or above, the trench and from the top surface of the handle substrate. The selective epitaxy processes deposit a compound semiconductor material. The doped semiconductor material portion functions as the gate of a vertical compound semiconductor field effect transistor.

20 Claims, 12 Drawing Sheets

(56) References Cited

U.S. PATENT DOCUMENTS

| | | | |
|---|---|---|---|
| 5,798,297 A * | 8/1998 | Winnerl | H01L 23/5226 257/E23.145 |
| 5,920,088 A * | 7/1999 | Augusto | H01L 21/823885 257/192 |
| 5,994,735 A * | 11/1999 | Maeda et al. | 257/329 |
| 6,396,085 B1 | 5/2002 | Yoshida | |
| 6,506,638 B1 * | 1/2003 | Yu | 438/156 |
| 6,803,317 B2 * | 10/2004 | Grivna | 438/694 |
| 7,141,479 B2 * | 11/2006 | Lachner | 438/311 |
| 7,682,943 B2 | 3/2010 | Samuelson et al. | |
| 7,745,813 B2 | 6/2010 | Samuelson et al. | |
| 8,183,572 B2 | 5/2012 | Kikkawa | |
| 8,674,470 B1 * | 3/2014 | Or-Bach | H01L 25/0657 257/499 |
| 8,803,206 B1 * | 8/2014 | Or-Bach | H01L 23/49838 257/278 |
| 2001/0040246 A1 | 11/2001 | Ishii | |
| 2005/0062161 A1 * | 3/2005 | Chen et al. | 257/758 |
| 2007/0075353 A1 | 4/2007 | Chen et al. | |
| 2009/0101969 A1 * | 4/2009 | Katsumata et al. | 257/329 |
| 2009/0215156 A1 | 8/2009 | Chung et al. | |
| 2011/0108850 A1 * | 5/2011 | Cheng et al. | 257/76 |
| 2013/0146885 A1 | 6/2013 | Brown et al. | |
| 2013/0146953 A1 * | 6/2013 | Cheng | H01L 21/84 257/296 |

\* cited by examiner

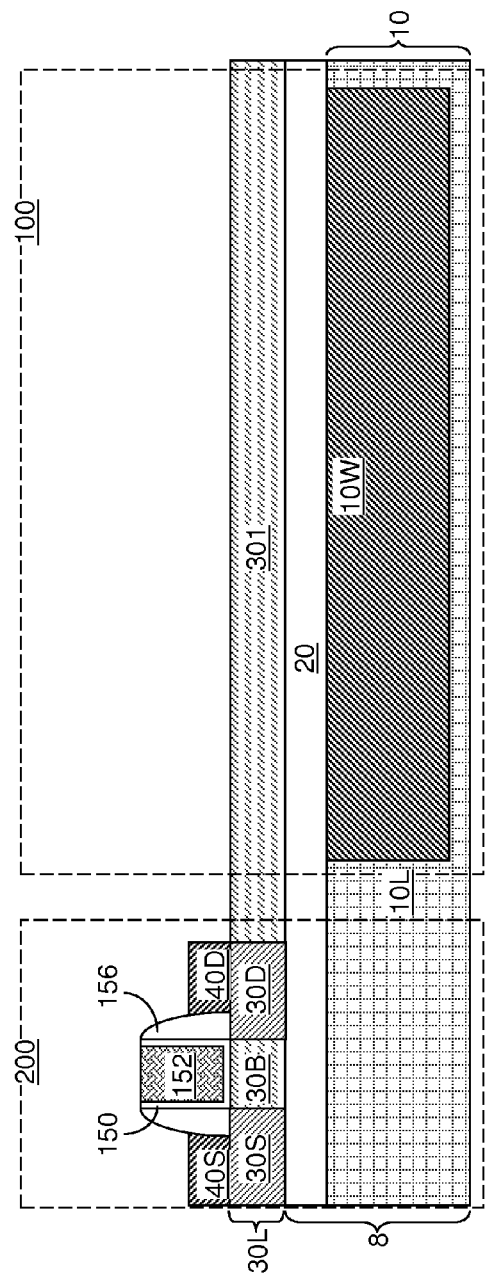
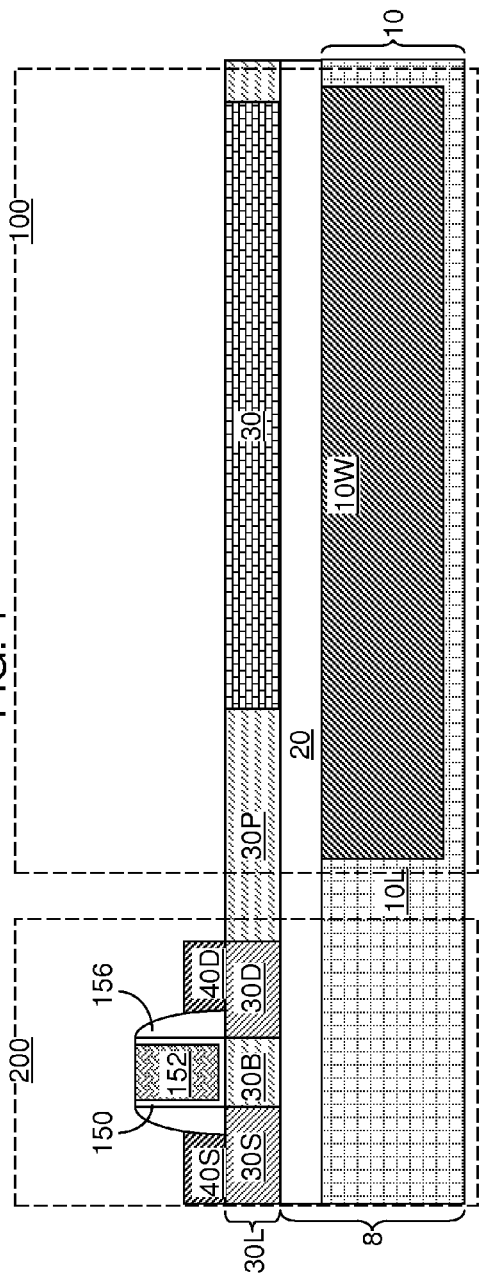

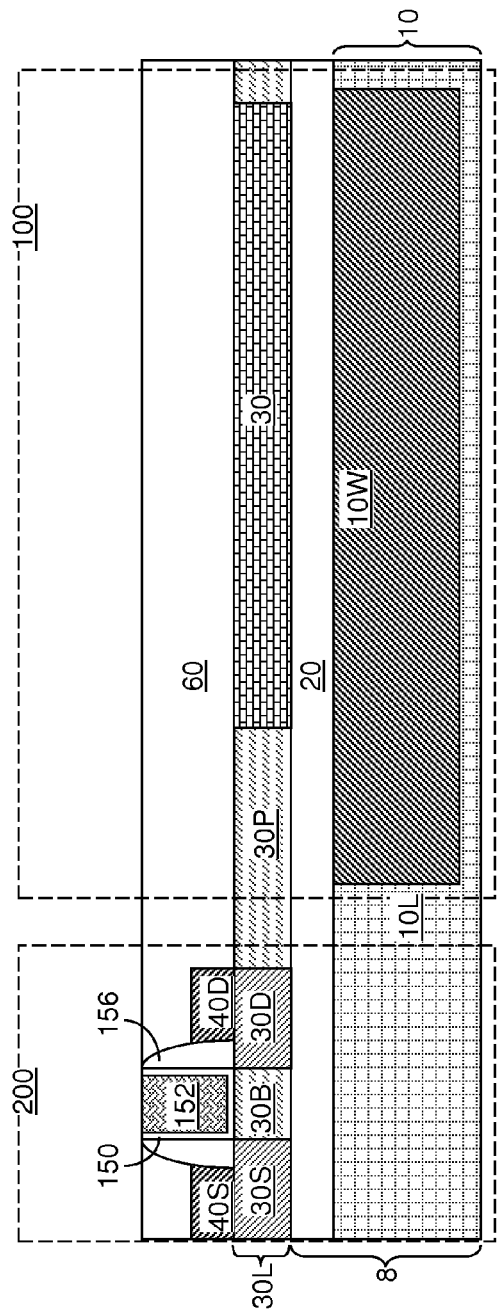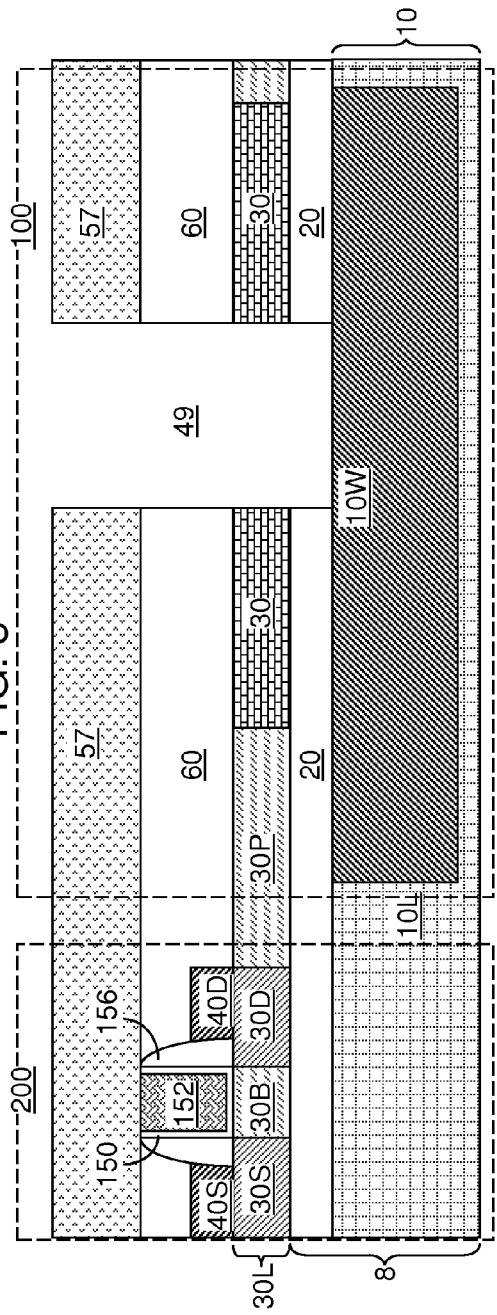

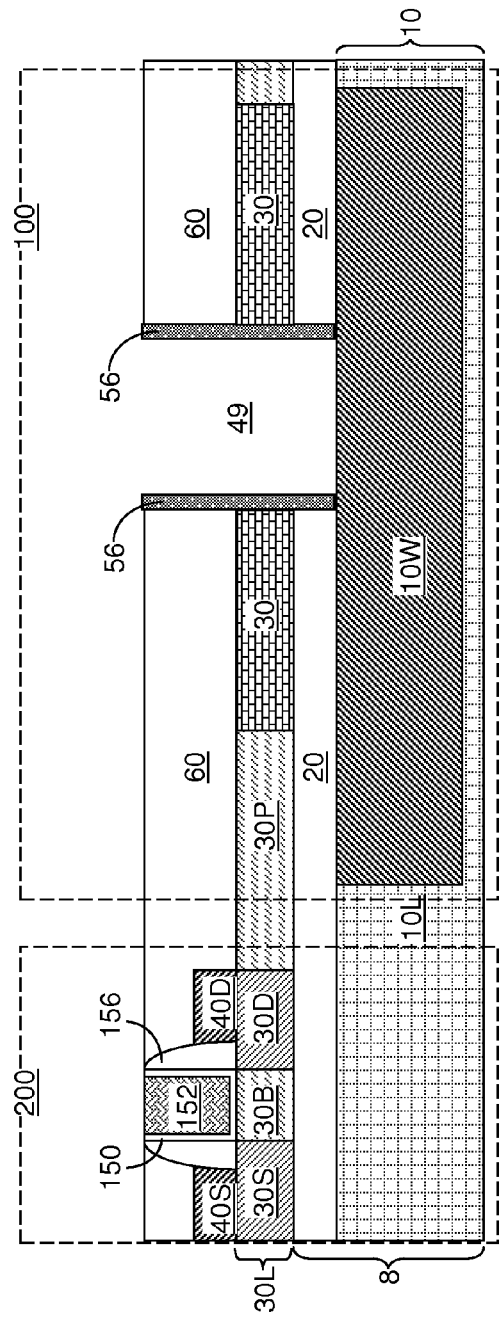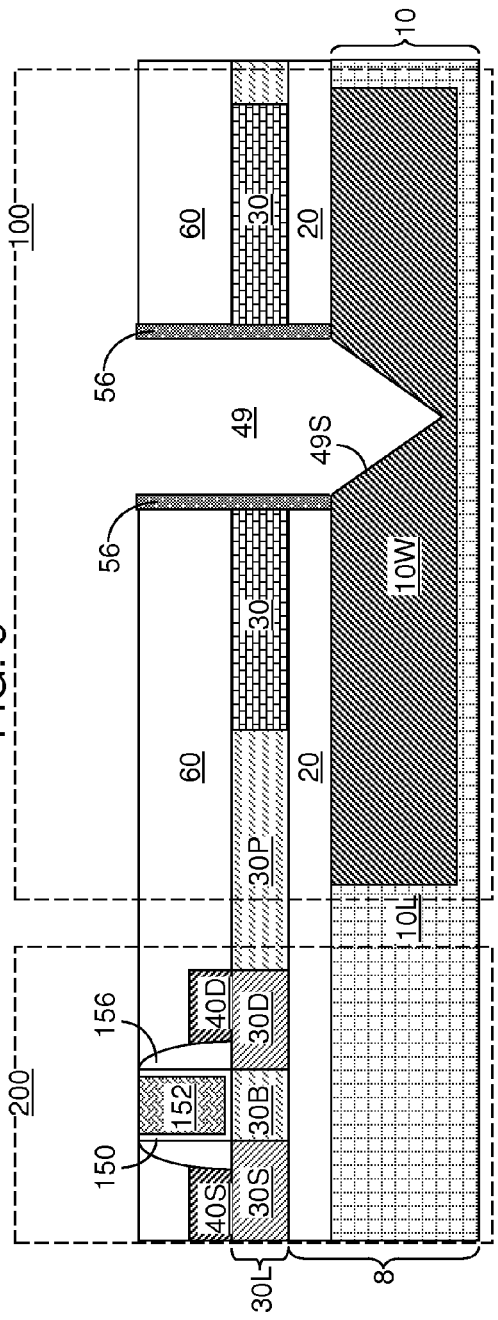

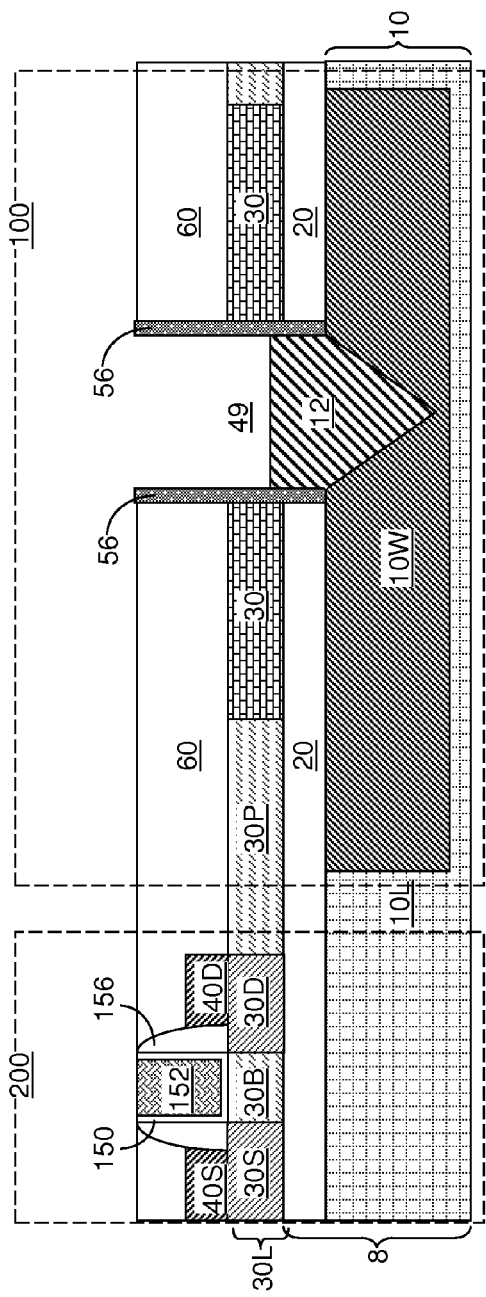
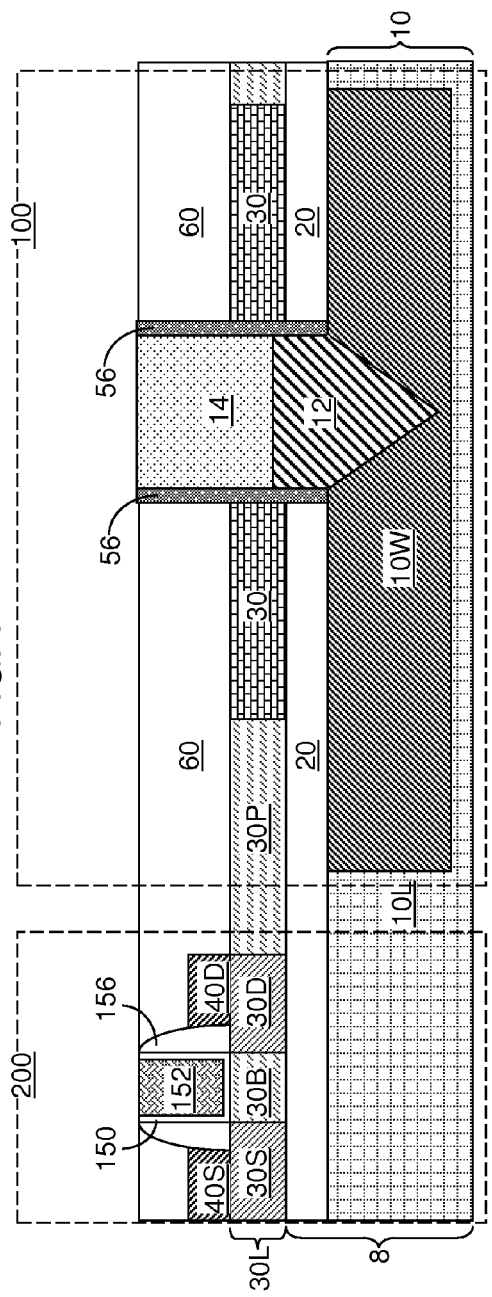

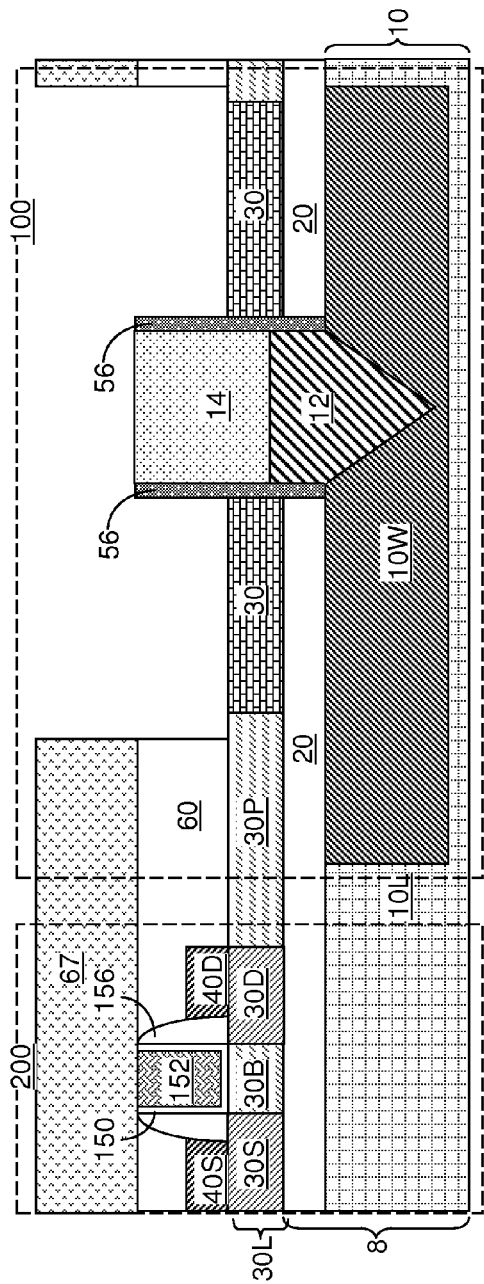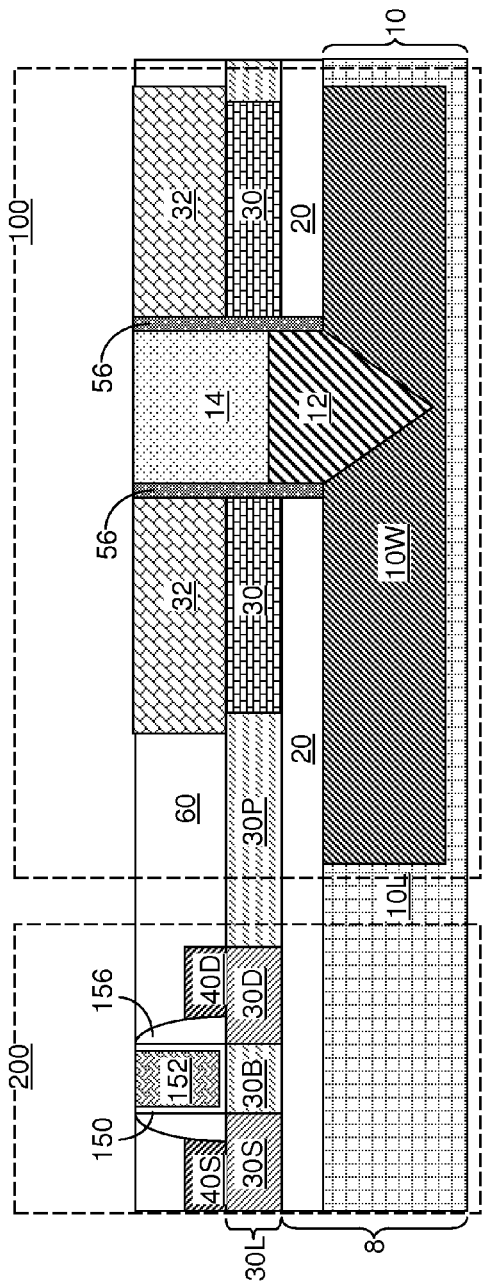

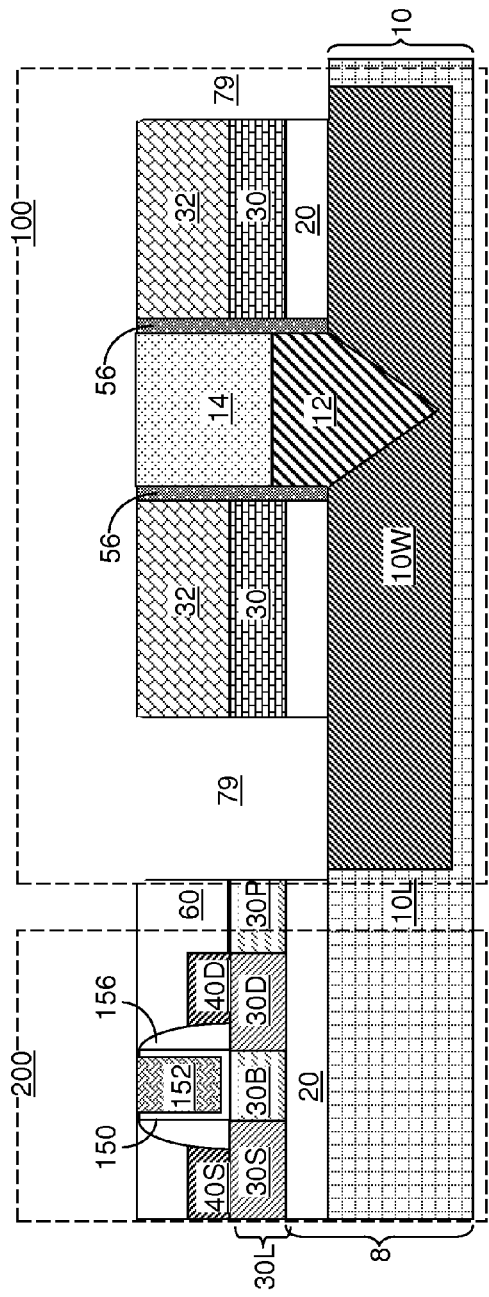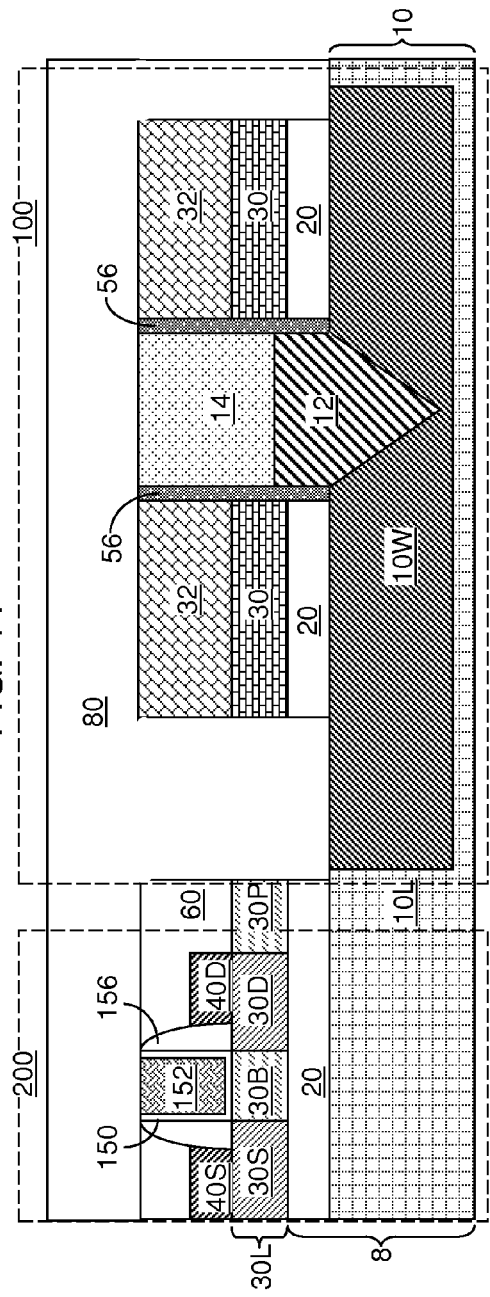

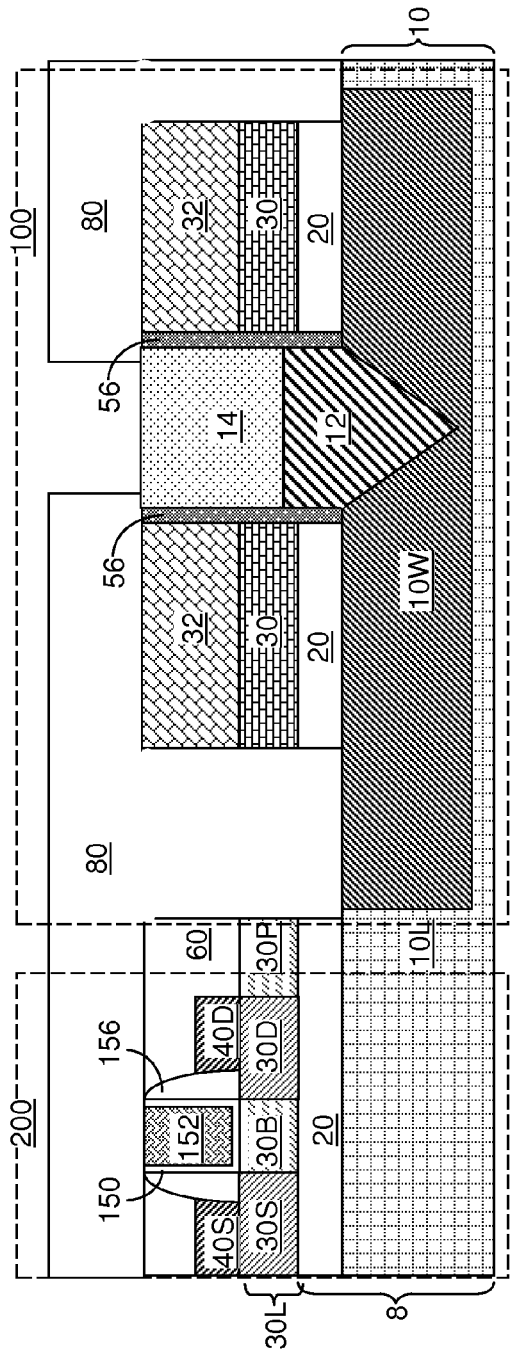
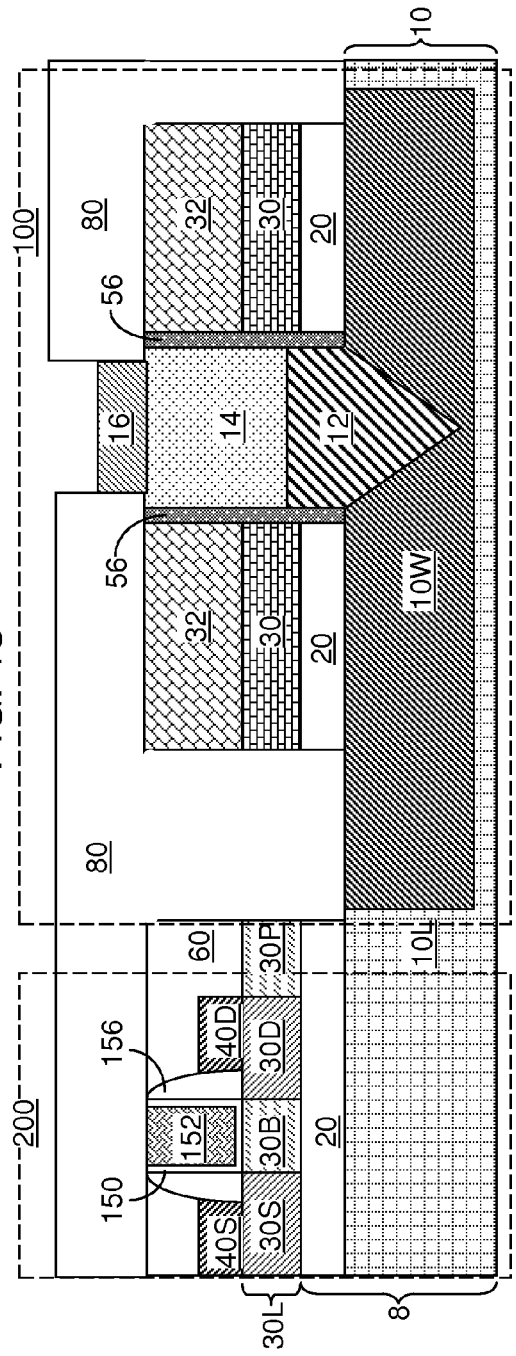

VERTICAL COMPOUND SEMICONDUCTOR FIELD EFFECT TRANSISTOR ON A GROUP IV SEMICONDUCTOR SUBSTRATE

BACKGROUND

The present disclosure relates to a semiconductor structure, and particularly to a vertical compound semiconductor field effect transistor on a group IV semiconductor substrate and a method of manufacturing the same.

A compound semiconductor field effect transistor employing a compound semiconductor material provides advantages and/or applications that field effect transistors employing a group IV semiconductor material. However, integration of compound semiconductor field effect transistors with field effect transistors employing a group IV semiconductor material on a same substrate poses significant challenges due to limited compatibility between processes for the two different materials. Thus, a method is desired for integrating devices employing a compound semiconductor material and devices employing a group IV semiconductor material.

SUMMARY

Group IV semiconductor devices can be formed on a semiconductor-on-insulator substrate including a handle substrate containing a group IV semiconductor material. A cavity is formed to physically expose a top surface of the handle substrate through a stack, from bottom to top, of a buried insulator layer, a doped semiconductor material portion in a top semiconductor layer, and a dielectric material layer. A gate dielectric is formed around the cavity by a conformal deposition of a dielectric material layer and an anisotropic etch. A lower active region, a channel region, and an upper active region are formed by selective epitaxy processes in, and/or above, the trench and from the top surface of the handle substrate. The selective epitaxy processes deposit a compound semiconductor material. The doped semiconductor material portion functions as the gate of a vertical compound semiconductor field effect transistor.

According to an aspect of the present disclosure, a semiconductor structure is provided, which includes a handle substrate including a doped Group IV semiconductor well, an insulator layer overlying the handle substrate, a doped semiconductor material portion overlying the insulator layer, and a vertical stack including a lower active region and a channel region. The vertical stack extends at least through the insulator layer and the doped semiconductor material portion and is laterally surrounded by a gate dielectric contacting sidewalls of the insulator layer and the doped semiconductor material portion. The lower active region and the channel region include a compound semiconductor material.

According to another aspect of the present disclosure, a method of forming a semiconductor structure is provided. A semiconductor-on-insulator substrate is provided, which includes, from bottom to top, a handle substrate including a doped Group IV semiconductor well, an insulator layer overlying the substrate, and a doped semiconductor material portion. A cavity is formed through the doped semiconductor material portion and the insulator layer. A gate dielectric is formed on sidewalls of the cavity. A vertical stack including a lower active region and a channel region is formed in the cavity.

BRIEF DESCRIPTION OF SEVERAL VIEWS OF THE DRAWINGS

FIG. 1 is a vertical cross-sectional view of a first exemplary semiconductor structure after formation of at least one Group IV semiconductor device on a substrate according to a first embodiment of the present disclosure.

FIG. 2 is a vertical cross-sectional view of the first exemplary semiconductor structure after formation of a doped semiconductor material portion in a top semiconductor layer according to the first embodiment of the present disclosure.

FIG. 3 is a vertical cross-sectional view of the first exemplary semiconductor structure after formation of a planarization dielectric layer according to the first embodiment of the present disclosure.

FIG. 4 is a vertical cross-sectional view of the first exemplary semiconductor structure after formation of a cavity extending down to a doped Group IV semiconductor portion according to the first embodiment of the present disclosure.

FIG. 5 is a vertical cross-sectional view of the first exemplary semiconductor structure after formation of a gate dielectric by deposition of a conformal dielectric material layer and an anisotropic etch according to the first embodiment of the present disclosure.

FIG. 6 is a vertical cross-sectional view of the first exemplary semiconductor structure after a facet-forming etch according to the first embodiment of the present disclosure.

FIG. 7 is a vertical cross-sectional view of the first exemplary semiconductor structure after formation of a lower active region by a first selective epitaxy process according to the first embodiment of the present disclosure.

FIG. 8 is a vertical cross-sectional view of the first exemplary semiconductor structure after formation of a channel region by a second selective epitaxy process according to the first embodiment of the present disclosure.

FIG. 9 is a vertical cross-sectional view of the first exemplary semiconductor structure after removal of a portion of the planarization dielectric layer according to the first embodiment of the present disclosure.

FIG. 10 is a vertical cross-sectional view of the first exemplary semiconductor structure after formation of a conductive material portion according to the first embodiment of the present disclosure.

FIG. 11 is a vertical cross-sectional view of the first exemplary semiconductor structure after formation of trench laterally surrounding the doped semiconductor material portion according to the first embodiment of the present disclosure.

FIG. 12 is a vertical cross-sectional view of the first exemplary semiconductor structure after formation of a contact level dielectric layer according to the first embodiment of the present disclosure.

FIG. 13 is a vertical cross-sectional view of the first exemplary semiconductor structure after formation of an opening overlying the channel region in the contact level dielectric layer according to the first embodiment of the present disclosure.

FIG. 14 is a vertical cross-sectional view of the first exemplary semiconductor structure after formation of an upper active region according to the first embodiment of the present disclosure.

DETAILED DESCRIPTION

Figure 4A:
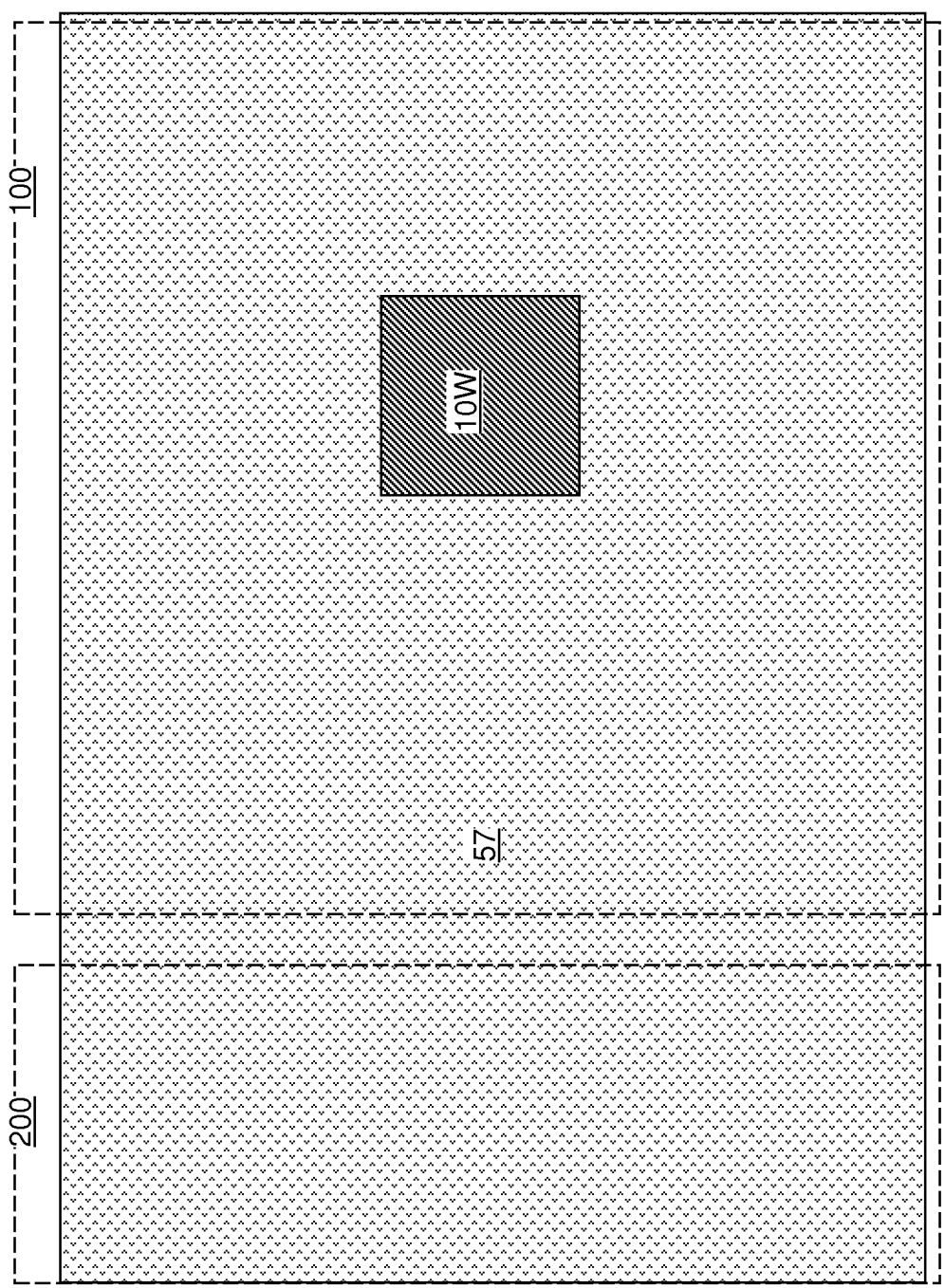
FIG. 4A is a top-down view of the first exemplary semiconductor structure of FIG. 4 according to the first embodiment of the present disclosure.

As stated above, the present disclosure relates to a vertical compound semiconductor field effect transistor on a group IV semiconductor substrate and a method of manufacturing the same. Aspects of the present disclosure are now described in detail with accompanying figures. It is noted that like reference numerals refer to like elements across different embodiments. The drawings are not necessarily drawn to scale.

Referring to FIG. 1, a first exemplary semiconductor structure according to a first embodiment of the present disclosure includes at least one Group IV semiconductor device formed on a semiconductor-on-insulator (SOI) substrate (8, 30L) and a doped Group IV semiconductor well 10W included in a handle substrate 10 of the SOI substrate (8, 30L). Specifically, the first exemplary semiconductor structure can include a first device region 100 in which the doped Group IV semiconductor well 10W is formed, and a second device region 200 in which the at least one Group IV semiconductor device is formed.

As used herein, a "Group IV semiconductor device" refers to a semiconductor device that includes a Group IV semiconductor material. As used herein, a "Group IV semiconductor material" refers to a semiconductor material in which a predominant percentage (more than 50%) of the atoms in the semiconductor material is made of silicon, germanium, and/or carbon. Exemplary Group IV semiconductor materials include silicon, germanium, a silicon-germanium alloy, a silicon-carbon alloy, and a silicon-germanium-carbon alloy. Dopant atoms may be present in the Group IV semiconductor material.

In one embodiment, the at least one Group IV semiconductor device can include a filed effect transistor as known in the art. For example, the source region 30S, the drain region 30D, and the body region 30B of the field effect transistor can include a Group IV semiconductor material. The source region 30S and the drain region 30D are herein collectively referred to as active regions (30S, 30D). The field effect transistor can include a gate dielectric 150, a gate electrode 152, a gate spacer 156, a raised source region 40S, and a raised drain region 40D.

The SOI substrate (8, 30L) includes a top semiconductor layer 30L and an underlying substrate 8. The top semiconductor layer 30L includes Group IV semiconductor material portions that are components of the at least one Group IV semiconductor device (such as the source region 3S, the drain region 3D, and the body region 3B), and an additional Group IV semiconductor material portion located within the first device region 100, which is herein referred to as a Group IV semiconductor material portion 301. The thickness of the top semiconductor layer 30L can be in a range from 10 nm to 200 nm, although lesser and greater thicknesses can also be employed.

The underlying substrate 8 includes a vertical stack, from bottom to top, of a handle substrate 10 and a buried insulator layer 20. The handle substrate 10 includes another Group IV semiconductor material, which is herein referred to as a first Group IV semiconductor material. The group IV semiconductor material of the top semiconductor layer 30L is herein referred to as a second Group IV semiconductor material. Thus, the field effect transistor in the second device region can include active regions (30S, 30D) that include the second semiconductor material.

The handle substrate 10 can be provided as a doped Group IV semiconductor material layer 10L including the first Group IV semiconductor material and having a uniform doping throughout the entirety thereof and having a same thickness throughout. The conductivity type of the doped Group IV semiconductor material layer 10L is herein referred to as a first conductivity type. The dopant concentration of the doped Group IV semiconductor material layer 10L can be, for example, in a range from $1.0 \times 10^{14}/cm^3$ to $3.0 \times 10^{18}/cm^3$, although lesser and greater dopant concentrations can also be employed.

The handle substrate 10 includes the doped Group IV semiconductor well 10W in the first device region 100. The doped Group IV semiconductor well 10W can be formed, for example, by ion implantation of dopants into a portion of the doped Group IV semiconductor material layer 10L within the first device region 100. The implanted portion of the doped Group IV semiconductor material layer 10L is converted into the doped Group IV semiconductor well 10W. The doped Group IV semiconductor well 10W can have a doping of the opposite conductivity type than the conductivity type of the doped Group IV semiconductor material layer 10L. The conductivity type of the doped Group IV semiconductor well 10W is herein referred to as a second conductivity type. A p-n junction is formed at the interface between the remaining portion of the doped Group IV semiconductor material layer 10L and the doped Group IV semiconductor well 10W.

The buried insulator layer 20 includes a dielectric material such as silicon oxide, silicon nitride, silicon oxynitride, sapphire, a dielectric metal oxide, a dielectric metal nitride, or a combination thereof. The thickness of the buried insulator layer 20 can be in a range from 10 nm to 500 nm, although lesser and greater thicknesses can also be employed.

Referring to FIG. 2, dopant ions can be implanted into a sub-portion of the Group IV semiconductor material portion 301 to form a doped semiconductor material portion 30. The doped semiconductor material portion 30 can have the same type of doping as, or a different type of doping from, the doped Group IV semiconductor well 10W, i.e., can have a doping of the second conductivity type or the first conductivity type. The unimplanted portions of the Group IV semiconductor material portion 301 are herein referred to as Group IV semiconductor material portions 30P.

Referring to FIG. 3, a planarization dielectric layer 60 is formed over the top semiconductor layer 30L and the gate structure(s) (150, 152) in the second device region 200. The planarization dielectric layer 60 includes a dielectric material such as silicon oxide, silicon nitride, organosilicate glass, or a dielectric metal oxide. In one embodiment, the planarization dielectric layer 60 can include doped silicate glass or undoped silicate glass. The planarization dielectric layer 60 can be planarized to provide a planar top surface, for example, by chemical mechanical planarization (CMP). The top surface(s) of the at least one gate structure (150, 152) in the second device region 200 can be employed as a stopping surface during the planarization process. In case the at least one gate structure (150, 152) is formed as at least one disposable gate structure, each disposable gate structure can be replaced with a replacement gate structure employing methods known in the art.

Referring to FIGS. 4 and 4A, a photoresist layer 57 is applied over the planarization dielectric layer 60, and is lithographically patterned to form an opening within the first device region 100. The pattern in the photoresist layer 57 is transferred through the planarization dielectric layer 60, the doped semiconductor material portion 30, and the buried insulator layer 20 employing at least one anisotropic etch. The last step of the at least one anisotropic etch may, or may not, be selective to the first Group IV semiconductor material of the doped Group IV semiconductor well 10W. A cavity 49 extending from the top surface of the photoresist layer 57 down to the doped Group IV semiconductor portion 10W can be formed by the at least one anisotropic etch. The photoresist layer 57 can be removed, for example, by ashing.

Referring to FIG. 5, a gate dielectric 56 can be formed by deposition of a conformal dielectric material layer and an anisotropic etch. The conformal dielectric material layer includes a dielectric material such as silicon oxide, silicon oxynitride, a dielectric metal oxide, a dielectric metal nitride, or a combination thereof. The conformal dielectric material layer can be formed by a conformal deposition method such as low pressure chemical vapor deposition (LPCVD) and/or atomic layer deposition. The conformal dielectric material layer contacts the entire bottom surface and sidewalls of the cavity 49, and is formed over the planarization dielectric layer 60. Any gate dielectric material known in the art can be employed for the conformal dielectric material layer. The anisotropic etch can be a reactive ion etch. The anisotropic etch removes horizontal portions of the conformal dielectric material layer. A remaining contiguous vertical portion of the conformal dielectric material layer located on the sidewalls of the cavity 49 constitutes the gate dielectric 56. The gate dielectric 56 contacts sidewalls of the doped semiconductor material portion 30, the planarization dielectric layer 60, and the buried insulator layer 20. The gate dielectric 56 can be topologically homeomorphic to a torus, i.e., has a shape that can be continuously deformed into a torus without creation or destruction of a singularity in mapping (which corresponds to forming a new throughhole or without destroying an existing throughhole).

Referring to FIG. 6, a facet-forming etch can be performed to etch the first Group IV semiconductor material in the doped Group IV semiconductor well 10W in a manner that forms crystallographic facets on the surfaces of the remaining portion of the doped Group IV semiconductor well 10W. A crystallographic etch is an etch process that forms crystallographic facets when performed on a suitable target semiconductor material. At least two non-horizontal crystallographic surfaces, which are crystallographic facets, can be formed on the doped Group IV semiconductor well 10W employing the crystallographic etch process.

A first example of a crystallographic etch is a wet etch process utilizing a pure TMAH (tetramethyl-ammonium hydroxide; $(CH_3)_4NOH$) solution. A second example is a wet etch process which comprises a pretreatment with SC1 clean consisting of a mixture of $H_2O$, $NH_4OH$, and $H_2O_2$, followed by an etch in a dilute hydrofluoric acid (DHF), then followed by another etch in an ammonium hydroxide solution ($NH_4OH$). A third example is a reactive ion etch used for deep trench formation in the DRAM processes. Any other crystallographic etch chemistry known in the art can also be employed.

Referring to FIG. 7, a lower active region 12 can be formed directly on the faceted surfaces of the doped Group IV semiconductor well 10W by a first selective epitaxy process that deposits a first compound semiconductor material. Any compound semiconductor material that can be epitaxially deposited directly on a semiconductor surface of the first Group IV semiconductor material may be employed as the first compound semiconductor material. In one embodiment, the first Group IV semiconductor material can be silicon, and the first compound semiconductor material can be selected from GaN, InAs, GaAs, $In_xGa_{1-x}N$, and $In_xGa_{1-x}As$. The value of x can be greater than 0 and less than 1. The first compound semiconductor material can be a single crystalline III-V compound semiconductor material.

In one embodiment, the crystallographic orientations of the single crystalline structure of the first Group IV semiconductor material in the handle substrate 10 and the orientations of the crystallographic facets on the surfaces of the doped Group IV semiconductor well 10W can be selected to facilitate the epitaxial growth of the first compound semiconductor material directly on the first Group IV semiconductor material. For example, silicon (111) surfaces may be provided as the faceted surfaces of the doped Group IV semiconductor well 10W, and GaN may be deposited such that a (100) surface is formed as the top surface of the lower active region 10. During the first selective epitaxy process, the first compound semiconductor material grows from the semiconductor surfaces of the first Group IV semiconductor material, and does not grow from dielectric surfaces such as the sidewall surfaces of the gate dielectric 56 and the top surface of the planarization dielectric layer 60. The entirety of the lower active region 12 can be epitaxially aligned to the single crystalline structure of the doped Group IV semiconductor well 10W.

The lower active region 12 can be formed with in-situ doping such that dopants of the second conductivity type, which is the same as the conductivity type of the doped Group IV semiconductor well 10W, are incorporated into the lower active region 12. Thus, the doped Group IV semiconductor material layer 10L can have a doping of the first conductivity type, and the lower active region 12 and the doped Group IV semiconductor well 10W can have a doping of the second conductivity type. In one embodiment, the top surface of the lower active region 12 can be located around the horizontal plane including the interface between the buried insulator layer 20 and doped semiconductor material portion 30. In one embodiment, the top surface of the lower active region 12 can be located above the horizontal plane including the interface between the buried insulator layer 20 and doped semiconductor material portion 30. In this case, the height of the portion of the lower active region 12 that protrudes above the horizontal plane including the bottom surface of the doped semiconductor material portion 30 can be in a range from 0.5 nm to 10 nm, although lesser and greater heights can also be employed.

Referring to FIG. 8, a channel region 14 can be formed directly on the surfaces of the lower active region 12 by a second selective epitaxy process that deposits a second compound semiconductor material. The second compound semiconductor material can be any compound semiconductor material that can be epitaxially deposited directly on the first compound semiconductor material. In one embodiment, the second compound semiconductor material can be selected from GaN, InAs, GaAs, $In_yGa_{1-y}N$, and $In_yGa_{1-y}As$. The value of y can be greater than 0 and less than 1. The second compound semiconductor material can be a single crystalline III-V compound semiconductor material. The second compound semiconductor material can be the same as, or can be different from, the first compound semiconductor material.

In one embodiment, the first compound semiconductor material can be doped GaN having a doping of the second conductivity type, and the second compound semiconductor material can be undoped GaN, i.e., intrinsic GaN. In another embodiment, the first compound semiconductor material can be doped GaN having a doping of the second conductivity type, and the second compound semiconductor material can be doped GaN having a doping of the first conductivity type. In one embodiment, the first conductivity type is p-type and the second conductivity type is n-type. In another embodiment, the first conductivity type can be n-type and the second conductivity type can be p-type. In case the channel region 14 is doped with dopants of the first conductivity type, the channel region 14 can be formed with in-situ doping.

The second compound semiconductor material can be deposited at least to the height of the top surface of the planarization dielectric layer 60. Any excess portion of the deposited second compound semiconductor material above the horizontal plane including the top surface of the planarization dielectric layer 60 can be removed, for example, by chemical mechanical planarization (CMP). The top surface of the planarization dielectric layer 60 can be employed as a stopping surface for the planarization process. In this case, a top surface of the channel region can be coplanar with the top surface of the planarization dielectric layer 60.

A vertical stack (12, 14) including the lower active region 12 and the channel region 14 is formed in the cavity 49 by the combination of the first selective epitaxy process and the second selective epitaxy process. The lower active region 12 and the channel region 14 include at least one compound semiconductor material, i.e., the first compound semiconductor material and the second compound semiconductor material that can be the same or different. In case the first compound semiconductor material and the second compound semiconductor material include the same III-V compound material and differ only by the dopants incorporated (or not incorporated) therein, the combination of the first selective epitaxy process and the second selective epitaxy process can be replaced with a single selective epitaxy process in which the dopant flow (and consequently, the dopant incorporation) change in the middle of the selective epitaxy process. The entirety of the at least one compound semiconductor material of the vertical stack (12, 14) can be deposited employing at least one selective epitaxy process with epitaxially alignment to the single crystalline structure of the doped Group IV semiconductor well 10.

Referring to FIG. 9, a photoresist layer 67 is applied over the planarization dielectric layer 60, and is lithographically patterned to form an opening. The area of the opening includes the entire area of the vertical stack (12, 14), the gate dielectric 56, and a portion of the planarization dielectric layer 60 that surrounds the gate dielectric 56. In one embodiment, the entire periphery of the opening can be laterally offset outward from the outer sidewalls of the gate dielectric 56. In one embodiment, the area of the opening in the photoresist layer 67 can include the entire area of the doped semiconductor material portion 30.

An etch process can be subsequently performed to remove physically exposed portions of the planarization dielectric layer 60 selective to the gate dielectric 56 and the doped semiconductor material portion 30. In an illustrative example, the gate dielectric 56 can include a dielectric metal oxide and/or a dielectric metal nitride, the doped semiconductor material portion 30 can include doped silicon or a doped silicon-germanium alloy, the planarization dielectric layer 60 can include silicon oxide, and the etch process can be a wet etch employing hydrofluoric acid, a dry etch process employing HF vapor, or a reactive ion etch employing a hydrofluorocarbon etchant and etches silicon oxide selective to semiconductor materials and the dielectric metal oxide/nitride of the gate dielectric 56. The etch process can be an isotropic etch process such as a wet etch process, or can be an anisotropic etch process such as a reactive ion etch process. The top surface of the doped semiconductor material portion 30 is physically exposed after the etch process. The photoresist layer 67 is subsequently removed, for example, by ashing.

Referring to FIG. 10, a conductive material can be deposited on the doped semiconductor material portion. The conductive material can include a doped semiconductor material or a metallic material. The conductive material is deposited directly on the top surface of the doped semiconductor material portion 30 and outer sidewalls of the gate dielectric 56.

In one embodiment, the conductive material includes a doped semiconductor material. The doped semiconductor material can have the same type of doping as the conductivity type of the doped semiconductor material portion 30, and can be deposited by a selective epitaxy process with in-situ doping. In one embodiment, a low temperature epitaxy (LTE) process as known in the art can be employed. Excess portions of the deposited doped semiconductor material can be removed from above the horizontal plane including the top surface of the planarization dielectric layer 60, for example, by chemical mechanical planarization. The remaining portion of the deposited doped semiconductor material constitutes a conductive material portion 32 having a top surface that is coplanar with the top surface of the planarization dielectric layer 60. In one embodiment, the doped semiconductor material of the conductive material portion 32 can be the same as the semiconductor material of the doped semiconductor material portion 30.

In another embodiment, the conductive material includes a metallic material, which can be an elemental metal, an intermetallic alloy, or a conductive metal nitride. Excess portions of the deposited metallic material can be removed from above the horizontal plane including the top surface of the planarization dielectric layer 60, for example, by chemical mechanical planarization. The remaining portion of the deposited metallic material constitutes a conductive material portion 32 having a top surface that is coplanar with the top surface of the planarization dielectric layer 60.

Figure 11A:
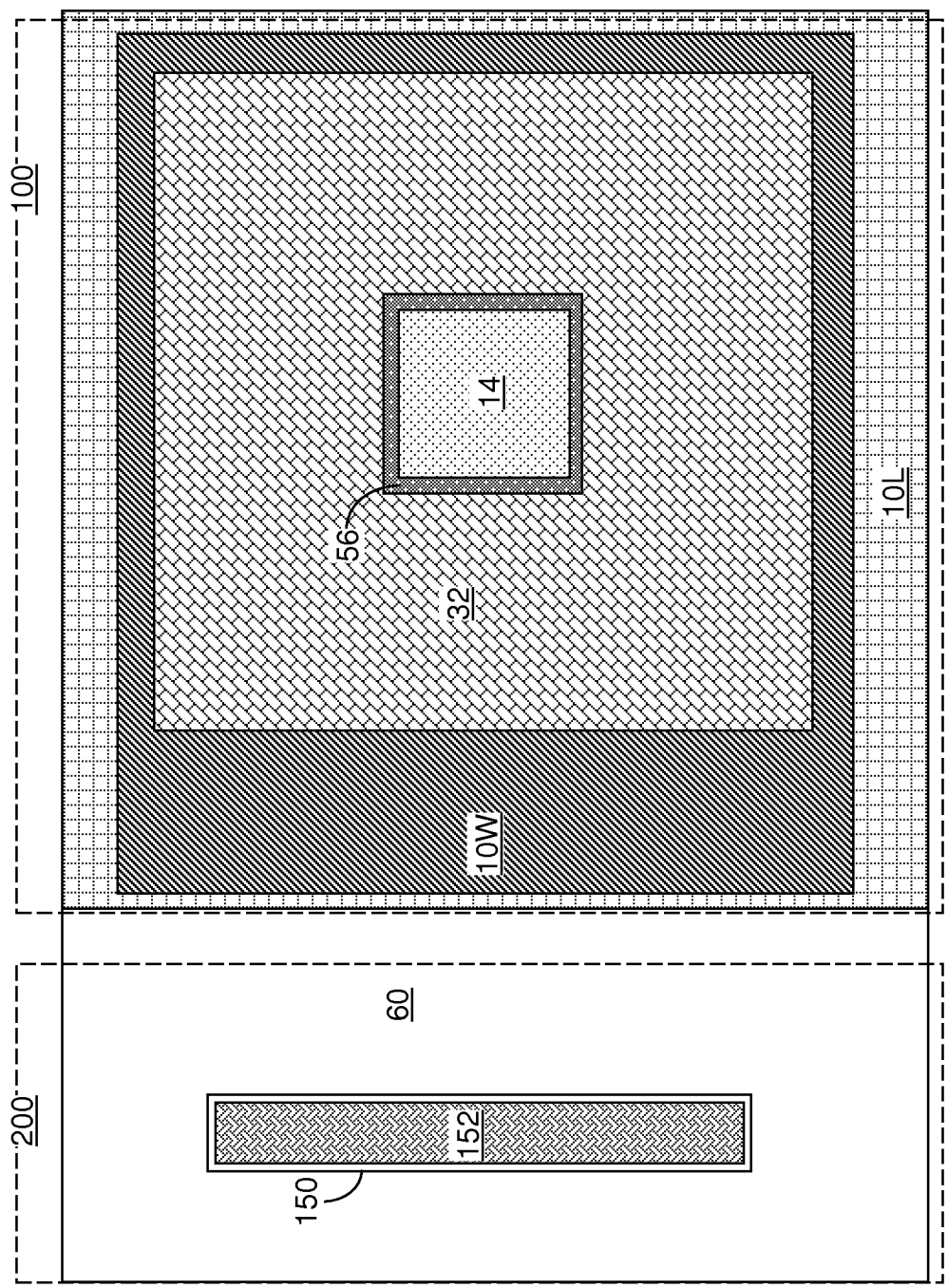
FIG. 11A is a top-down view of the first exemplary semiconductor structure of FIG. 11 according to the first embodiment of the present disclosure.

Referring to FIGS. 11 and 11A, a trench 79 laterally surrounding the gate dielectric 56 is formed at least through the planarization dielectric layer 60 and the conductive material portion 32, and the top semiconductor layer 30L. The formation of the trench can be effected, for example, by applying a photoresist layer (not shown) on the top surface of the planarization dielectric layer 60 and the conductive material portion 32, lithographically patterning the photoresist layer, and etching regions of the planarization dielectric layer 60 and the conductive material portion 32, the top semiconductor layer 30L, and optionally the buried insulator layer 20 by an anisotropic etch employing the photoresist layer as an etch mask. The trench 79 may extend through the buried insulator layer 20 to physically expose a top surface of the doped Group IV semiconductor well 10W. Alternatively, the bottom surface of the trench may be at the top surface of the buried insulator layer 20, or between the top surface and the bottom surface of the buried insulator layer 20. In one embodiment, the trench 79 can be formed such that a ring-shaped stack of the doped semiconductor material portion 30 and the conductive material portion 32 laterally surround, and contact the outer sidewalls of, the gate dielectric 56. The photoresist layer can be removed, for example, by ashing.

Referring to FIG. 12, a dielectric material is deposited within the trench 79 and over the planarization dielectric layer 60, the conductive material portion 32, the gate dielectric 56, and the channel region 14. A contact level dielectric layer 80 is formed by the deposited dielectric material, which fills the trench 79 and overlies the planarization dielectric layer 60, the conductive material portion 32, the gate dielectric 56, and the channel region 14. The contact level dielectric layer 80 can include a dielectric material such as doped silicate glass, undoped silicate glass, organosilicate glass, and/or silicon nitride. The dielectric material can be deposited by a conformal deposition method such as chemical vapor deposition and/or spin coating.

Referring to FIG. 13, an opening overlying the channel region 14 can be formed within the contact level dielectric layer 80. The opening in the contact level dielectric layer 80 has an area that is entirely within the area of the channel region 14. The opening in the contact level dielectric layer 80 can be formed, for example, by applying a photoresist layer over the contact level dielectric layer 80, lithographically patterning the contact level dielectric layer 80, and by transferring the pattern in the photoresist layer through the contact level dielectric layer 80 so that a portion of the top surface of the channel region 14 is physically exposed underneath the opening. The photoresist layer can be subsequently removed, for example, by ashing.

Referring to FIG. 14, an upper active region 16 including a third compound semiconductor material can be formed directly on, and in epitaxial alignment with, the channel region 14. The upper active region 16 can be formed directly on the surfaces of the channel region 14 by a third selective epitaxy process that deposits a third compound semiconductor material. The third compound semiconductor material can be any compound semiconductor material that can be epitaxially deposited directly on the second compound semiconductor material. In one embodiment, the third compound semiconductor material can be selected from GaN, InAs, GaAs, $In_zGa_{1-z}N$, and $In_zGa_{1-z}As$. The value of z can be greater than 0 and less than 1. The third compound semiconductor material can be a single crystalline III-V compound semiconductor material. The third compound semiconductor material can be the same as, or can be different from, the first compound semiconductor material and/or the second compound semiconductor material.

In one embodiment, the first compound semiconductor material can be doped GaN having a doping of the second conductivity type, and the second compound semiconductor material can be intrinsic GaN, and the third compound semiconductor material can be doped GaN having a doping of the second conductivity type. In another embodiment, the first compound semiconductor material can be doped GaN having a doping of the second conductivity type, and the second compound semiconductor material can be doped GaN having a doping of the first conductivity type, and the third compound semiconductor material can be doped GaN having a doping of the second conductivity type. In one embodiment, the first conductivity type is p-type and the second conductivity type is n-type. In another embodiment, the first conductivity type can be n-type and the second conductivity type can be p-type. In case the upper active region 15 can be formed with in-situ doping or with ex-situ doping employing ion implantation of electrical dopants.

The third compound semiconductor material can be deposited to a height lower than the height of the top surface of the contact level dielectric layer 80. Alternately, the third compound semiconductor material can fill the entirety of the opening in the contact level dielectric layer 80 and excess portions of the third compound semiconductor material can be removed from above the plane including the top surface of the contact level dielectric layer 80. Subsequently, the third compound semiconductor material can be vertically recessed such that the top surface of the upper active region 16 is located between the horizontal plane including the top surface of the contact level dielectric layer 80 and the top surface of the planarization dielectric layer 60.

In one embodiment, the lower active region 12 can be the source region of a vertical field effect formed in the first device region 100, and the upper active region 16 can be the drain region of the vertical field effect transistor. In another embodiment, the lower active region 12 can be the drain region of a vertical field effect transistor formed in the first device region 100, and the upper active region 16 can be the source region of the vertical field effect transistor.

Figure 15:
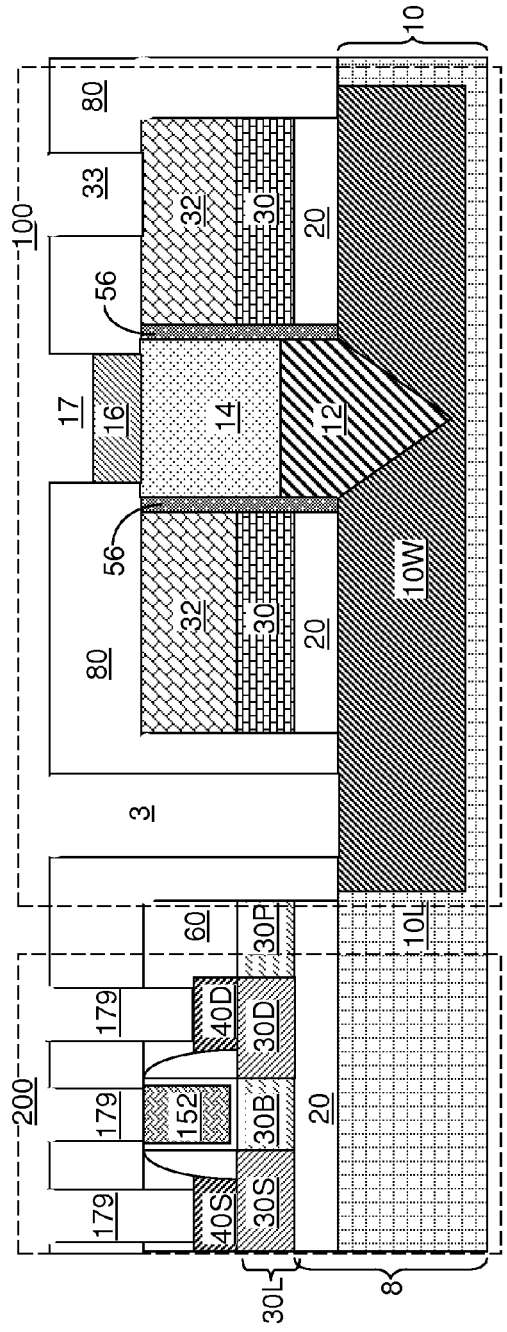
FIG. 15 is a vertical cross-sectional view of the first exemplary semiconductor structure after formation of various contact via cavities according to the first embodiment of the present disclosure.

Referring to FIG. 15, various contact via cavities (3, 33, 179) are formed through the contact level dielectric layer 80. The various contact via structures (3, 33, 179) can be formed, for example, by applying a photoresist layer over the top surface of the contact level dielectric layer 80, lithographically patterning the photoresist layer to form openings therein, and transferring the pattern of the opening through the contact level dielectric layer 80 and the planarization dielectric layer 60 employing an anisotropic etch. The various contact via cavities (3, 33, 179) include a well contact via cavity 3, a gate contact via cavity 33, and Group IV semiconductor device contact via cavities 179. The well contact via cavity 3 extends through the contact level dielectric layer 80 and extends to a top surface of the doped Group IV semiconductor well 10. The gate contact via cavity 33 extends through the contact via level dielectric layer 80 and extends to a top surface of the conductive material portion 32. The Group IV semiconductor device contact via cavities 179 extend through the contact level dielectric layer 80 and optionally through the planarization dielectric layer 60 to top surfaces of various elements of the at least one Group IV semiconductor device in the second device region 200. A cavity that is present above the upper active region 16, as formed at the processing step of FIG. 14, constitutes an upper active region contact via cavity 17.

Figure 16:
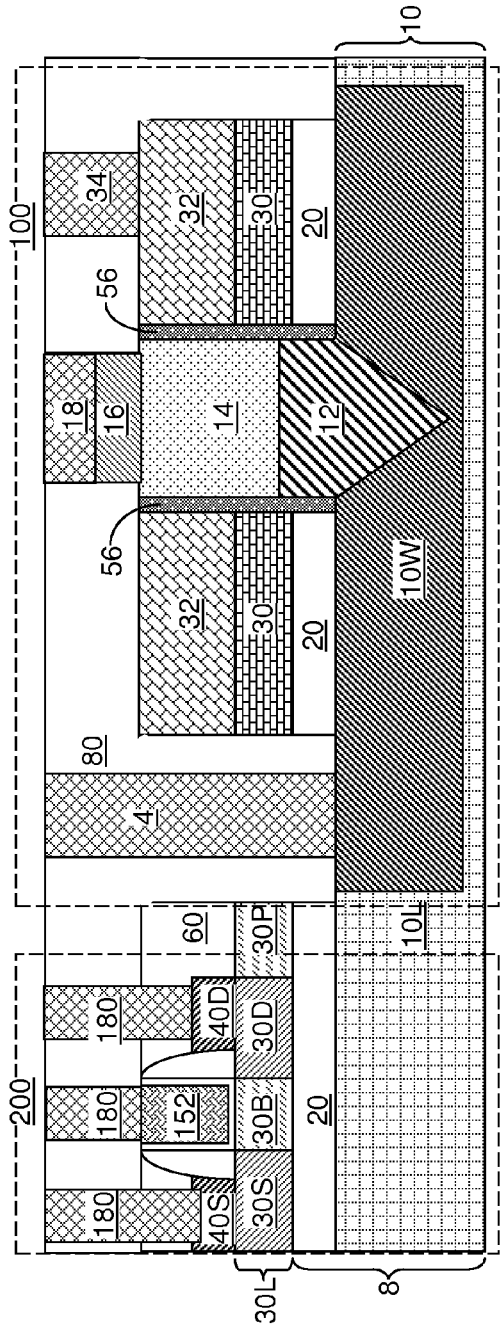
FIG. 16 is a vertical cross-sectional view of the first exemplary semiconductor structure after formation of various contact via structures according to the first embodiment of the present disclosure.
Figure 16A:
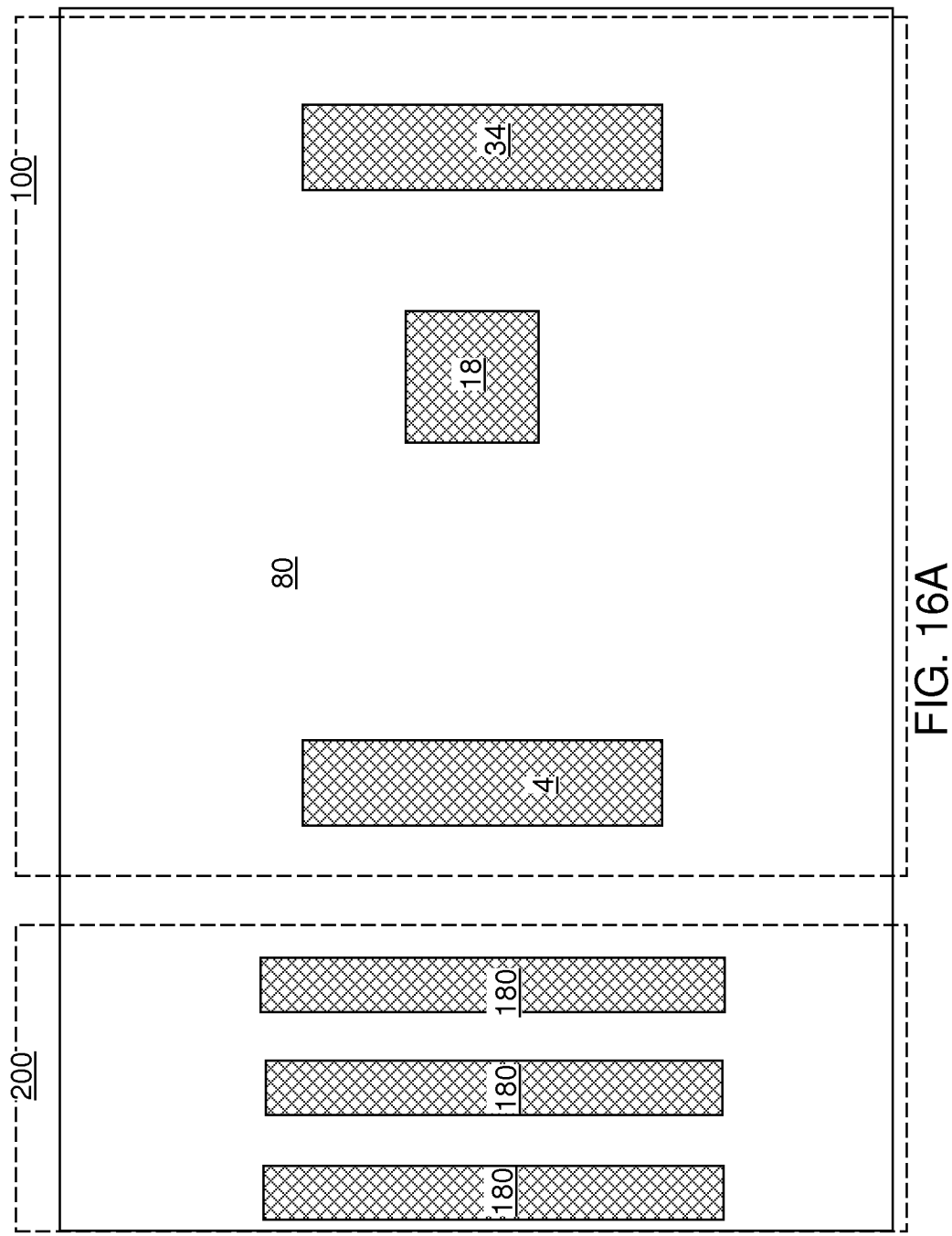
FIG. 16A is a top-down view of the first exemplary semiconductor structure of FIG. 16.

Referring to FIGS. 16 and 16A, various contact via structures (4, 34, 18, 180) are formed by filling the various contact via cavities (3, 33, 17, 179) with a conductive material. The contact via structures include a well contact via structure 4 in contact with the doped Group IV semiconductor well 10W, a gate electrode contact via structure 34 in contact with the conductive material portion 32, an upper active region contact via structure 18 in contact with the upper active region 16, and Group IV semiconductor device contact via structures 180 in contact with various elements of the at least one Group IV semiconductor device in the second device region 200.

One of the lower active region 12 and the upper active region 16 functions as a source region of the vertical field effect transistor in the first device region 100, and the other of the lower active region 12 and the upper active region 16 functions as a drain region of the vertical field effect transistor in the first device region 100. The combination of the doped semiconductor material portion 30 and the conductive material portion 32 functions as the gate electrode of the vertical field effect transistor. The doped Group IV semiconductor well 10W functions a lead structure that electrically shorts the lower active region 12 and the well contact via structure 4.

The first exemplary semiconductor structure includes at least a handle substrate 10 including a doped Group IV semiconductor well 10W; an insulator layer, i.e., the buried insulator layer 20 overlying the handle substrate 10; a doped semiconductor material portion 30 overlying the buried insulator layer 20; and a vertical stack (12, 14) including a lower active region 12 and a channel region 14. The vertical stack (12, 14) extends at least through the insulator layer and the doped semiconductor material portion 30, and is laterally surrounded by a gate dielectric 56 contacting sidewalls of the buried insulator layer 20 and the doped semiconductor material portion 30. The lower active region 12 and the channel region 14 include at least one compound semiconductor material, i.e., a first compound semiconductor material and a second compound semiconductor material.

In one embodiment, at least two non-horizontal crystallographic surfaces of the doped Group IV semiconductor well 10W are in physical contact with the lower active region 12. In one embodiment, the entirety of the at least one compound semiconductor material is epitaxially aligned to the doped Group IV semiconductor well 10W. The at least one compound semiconductor material can include a single crystalline semiconductor material containing a III-V compound semiconductor material. In one embodiment, each of the first and second compound semiconductor materials can be a single crystalline semiconductor material containing a III-V compound semiconductor material.

The doped semiconductor material portion 30 is electrically isolated from the vertical stack (12, 14) by the gate dielectric 56. The entirety of sidewalls of the vertical stack (12, 14) can be in physical contact with the gate dielectric 56.

The first exemplary semiconductor structure can further include a conductive material portion 32 contacting a top surface of the doped semiconductor material portion 30 and outer sidewalls of the gate dielectric 56. The first exemplary semiconductor structure can further include a contact level dielectric layer 80 overlying the conductive material portion 32, and an upper active region 16 including one of said at least one compound semiconductor material or another compound semiconductor material, epitaxially aligned to the channel region 14, and overlying the channel region 14.

The first exemplary semiconductor structure can further include a field effect transistor located on the buried insulator layer 20 and including active regions (30S, 30D) that include the same Group IV semiconductor material as the doped semiconductor material portion 30.

Figure 17:
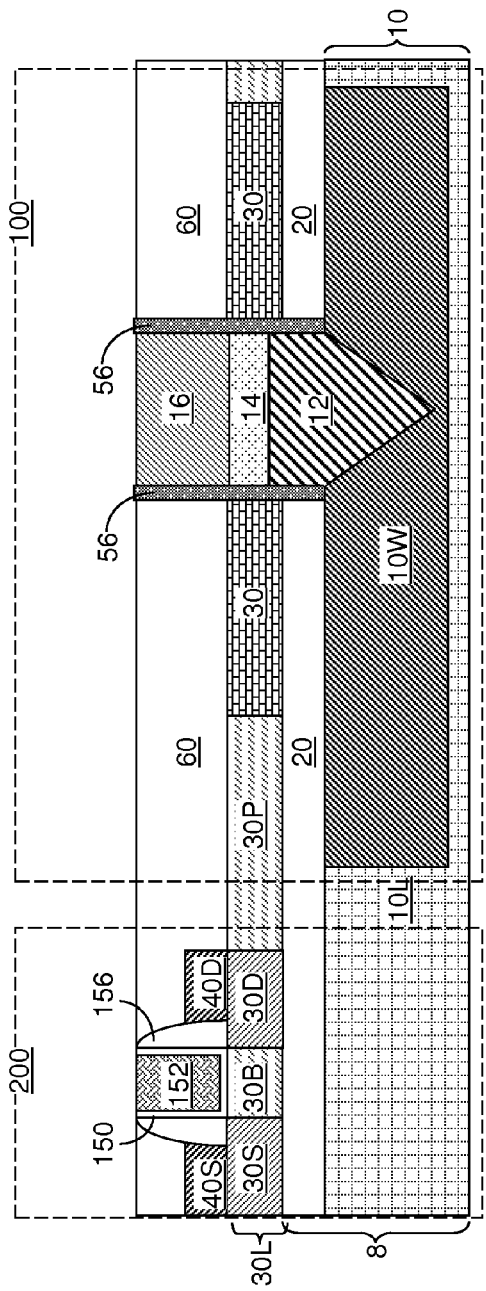
FIG. 17 is a vertical cross-sectional view of a second exemplary semiconductor structure after formation of a lower active region, a channel region, and an upper active region according to a second embodiment of the present disclosure.

Referring to FIG. 17, a second exemplary semiconductor structure according to a second embodiment of the present disclosure can be derived from the first exemplary semiconductor structure by forming the channel region 14 such that the top surface of the channel region is about the height of the top surface of the doped semiconductor material portion 30 at the processing step of FIG. 14. In one embodiment, the second selective epitaxy process can be terminated such that the top surface of the channel region 14 is formed about the height of the top surface of the doped semiconductor material portion 30. In another embodiment, after formation of the structure of FIG. 8, the top surface of the channel region can be recessed selective to the planarization dielectric layer 60 by a recess etch until the top surface of the remaining portion of the channel region 14 is formed about the height of the top surface of the doped semiconductor material portion 30.

In one embodiment, the top surface of the channel region 14 can be located around the horizontal plane including the interface between the doped semiconductor material portion 30 and the planarization dielectric layer 60. In one embodiment, the top surface of the channel region 14 can be located below the horizontal plane including the interface between the doped semiconductor material portion 30 and the planarization dielectric layer 60. In this case, the top surface of the channel region 14 can be recessed relative to the horizontal plane including the interface between the doped semiconductor material portion 30 and the planarization dielectric layer 60 by a vertical distance, which can be in a range from 0.5 nm to 10 nm, although lesser and greater recess distances can also be employed.

After formation of the channel region 14, the third selective epitaxy process corresponding to the processing step of FIG. 14 can be performed to form the upper active region 16. A planarization process can be performed to remove excess portions of the third compound semiconductor material from above the top surface of the planarization dielectric layer 60. In this case, the top surface of the upper active region 16 can be coplanar with the top surface of the planarization dielectric layer 60.

Figure 18:
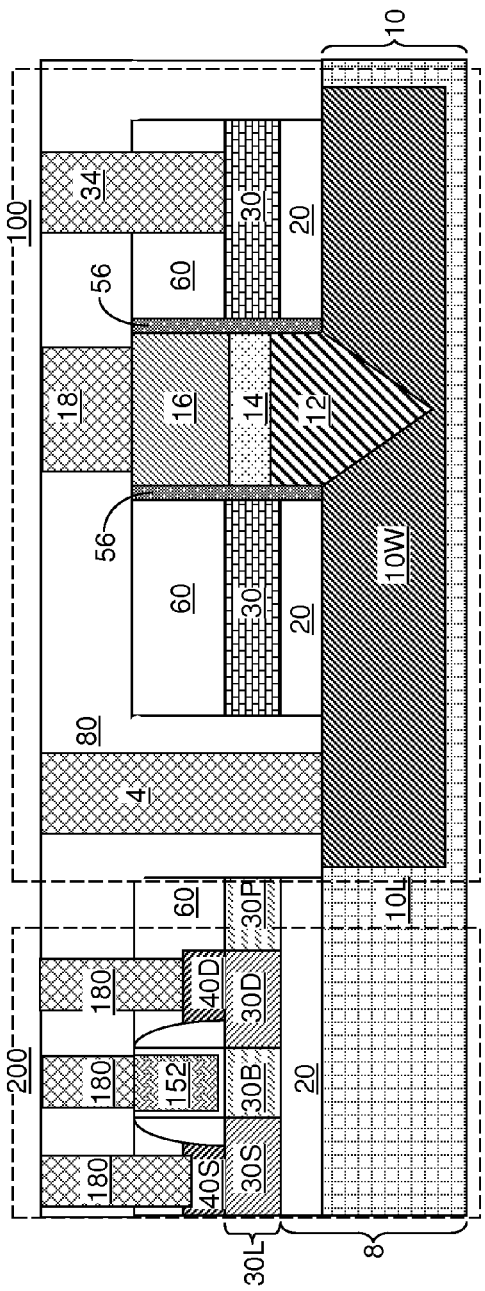
FIG. 18 is a vertical cross-sectional view of the second exemplary semiconductor structure after formation of various contact via structures according to the second embodiment of the present disclosure.

Referring to FIG. 18, the processing steps of FIGS. 11 and 11A, 12, 15, and 16 are subsequently performed to form a trench 17 laterally surrounding the vertical stack of the lower active region 12, the channel region 14, and the upper active region 16; a contact level dielectric layer 80, and various contact via structures (4, 34, 18, 180). In this case, an additional opening can be formed through the contact level dielectric layer 80 at the processing step of FIG. 15 so that an upper active region contact via cavity 17 can be formed directly above the top surface of the upper active region 16.

The exemplary semiconductor structures of the present disclosure provide a vertical field effect transistor including at least one compound semiconductor material for the source region, the channel region, and the drain region on a handle substrate 10 including a Group IV semiconductor material. Thus, a compound semiconductor material device can be formed with Group IV semiconductor devices on the same substrate that includes a handle substrate 10 containing a Group IV semiconductor material.

While the disclosure has been described in terms of specific embodiments, it is evident in view of the foregoing description that numerous alternatives, modifications and variations will be apparent to those skilled in the art. Each of the embodiments described herein can be implemented individually or in combination with any other embodiment unless expressly stated otherwise or clearly incompatible. Accordingly, the disclosure is intended to encompass all such alternatives, modifications and variations which fall within the scope and spirit of the disclosure and the following claims.

What is claimed is:
1. A semiconductor structure comprising:
a handle substrate including a doped Group IV semiconductor well;
an insulator layer overlying said handle substrate;
a doped semiconductor material portion overlying a first portion of said insulator layer that is located over said doped Group IV semiconductor well;
a vertical stack including a lower active region and a channel region, said vertical stack extending at least through said first portion of said insulator layer and said doped semiconductor material portion and laterally surrounded by a gate dielectric contacting sidewalls of said first portion of said insulator layer and said doped semiconductor material portion, and wherein said lower active region and said channel region comprise at least one compound semiconductor material; and a field effect transistor overlying a second portion of said insulator layer, said field effect transistor comprising active regions composed of a same Group IV semiconductor material as said doped semiconductor material portion, wherein top surfaces of said active regions of said field effect transistor are coplanar with a top surface of said doped semiconductor material portion.

2. The semiconductor structure of claim 1, wherein at least two non-horizontal crystallographic surfaces of said doped Group IV semiconductor well are in physical contact with said lower active region.

3. The semiconductor structure of claim 1, wherein an entirety of said at least one compound semiconductor material is epitaxially aligned to said doped Group IV semiconductor well.

4. The semiconductor structure of claim 3, wherein said at least one compound semiconductor material comprises a single crystalline semiconductor material containing a nitride of at least one Group III element.

5. The semiconductor structure of claim 1, wherein said doped semiconductor material portion is electrically isolated from said vertical stack by said gate dielectric.

6. The semiconductor structure of claim 1, wherein an entirety of sidewalls of said vertical stack is in physical contact with said gate dielectric.

7. The semiconductor structure of claim 1, further comprising a conductive material portion contacting a top surface of said doped semiconductor material portion and outer sidewalls of said gate dielectric.

8. The semiconductor structure of claim 7, further comprising:
a contact level dielectric layer overlying said conductive material portion; and
an upper active region comprising one of said at least one compound semiconductor material or another compound semiconductor material, epitaxially aligned to said channel region, and overlying said channel region.

9. The semiconductor structure of claim 1, further comprising an upper active region comprising one of said at least one compound semiconductor material or another compound semiconductor material, epitaxially aligned to said channel region, and contacting inner sidewalls of said gate dielectric.

10. The semiconductor structure of claim 1, wherein said field effect transistor further comprises a gate structure overlying one of said active regions, said gate structure having a top surface coplanar with a top surface of said channel region.

11. The semiconductor structure of claim 1, wherein said doped Group IV semiconductor well extends across an entire length of said doped semiconductor material portion such that exposed sidewalls of said doped semiconductor material portion are offset from sidewalls of said doped Group IV semiconductor well.

12. A method of forming a semiconductor structure comprising:
providing a semiconductor-on-insulator (SOI) substrate including, from bottom to top, a handle substrate including a doped Group IV semiconductor well, an insulator layer overlying said handle substrate, and a top semiconductor layer overlying said insulator layer, wherein said doped Group IV semiconductor well is located in a first region of said SOI substrate;
forming a field effect transistor in a second region of said SOI substrate, said field effect transistor comprising active regions located within a portion of said top semiconductor layer;
forming a doped semiconductor material portion within another portion of said top semiconductor layer overlying said doped Group IV semiconductor well;
forming a cavity through said doped semiconductor material portion and said insulator layer;
forming a gate dielectric on sidewalls of said cavity; and
forming a vertical stack including a lower active region and a channel region in said cavity.

13. The method of claim 12, wherein said lower active region and said channel region comprise at least one compound semiconductor material.

14. The method of claim 13, further comprising forming at least two non-horizontal crystallographic surfaces on said doped Group IV semiconductor well employing a crystallographic etch process prior to forming said vertical stack.

15. The method of claim 13, wherein an entirety of said at least one compound semiconductor material is deposited employing a selective epitaxy process with epitaxially alignment to a single crystalline structure of said doped Group IV semiconductor well.

16. The method of claim 15, wherein said at least one compound semiconductor material comprises a single crystalline semiconductor material containing a nitride of at least one Group III element.

17. The method of claim 12, wherein said gate dielectric is formed by:
depositing a dielectric material layer on a bottom surface and sidewalls of said cavity and over said insulator layer; and
anisotropically etching said dielectric material layer to remove horizontal portions of said dielectric material layer, wherein a remaining contiguous portion on said sidewalls of said cavity constitutes said gate dielectric.

18. The method of claim 1, further comprising forming a conductive material portion directly on a top surface of said doped semiconductor material portion and outer sidewalls of said gate dielectric.

19. The method of claim 18, further comprising:
forming a contact level dielectric layer over said conductive material portion; and
forming an upper active region comprising one off said at least one compound semiconductor material or another compound semiconductor material directly on, and in epitaxial alignment with, said channel region.

20. The method of claim 12, further comprising forming an upper active region comprising one of said at least one compound semiconductor material or another compound semiconductor material directly on, and in epitaxial alignment with, said channel region and directly on inner sidewalls of said gate dielectric.

* * * * *